United States Patent
Collins et al.

(10) Patent No.: US 7,239,523 B1
(45) Date of Patent: Jul. 3, 2007

(54) ELECTRONIC ASSEMBLY WITH MODULAR MIDPLANE

(75) Inventors: David C. Collins, Burlington, MA (US); Christine A. Harrison, Amesbury, MA (US)

(73) Assignee: Ciena Corporation, Linthicum, MD (US)

( * ) Notice: Subject to any disclaimer, the term of this patent is extended or adjusted under 35 U.S.C. 154(b) by 90 days.

(21) Appl. No.: 11/093,285

(22) Filed: Mar. 30, 2005

(51) Int. Cl.
*H05K 5/00* (2006.01)
(52) U.S. Cl. ............ 361/752; 361/683; 361/788
(58) Field of Classification Search .......... 361/683, 361/686, 788, 684; 439/61
See application file for complete search history.

(56) References Cited

U.S. PATENT DOCUMENTS

| | | | | |
|---|---|---|---|---|
| 4,918,572 A | | 4/1990 | Tarver et al. | |
| 5,268,637 A | * | 12/1993 | Liken et al. | 324/158.1 |
| 5,407,362 A | * | 4/1995 | Carstens et al. | 439/347 |
| 5,579,204 A | * | 11/1996 | Nelson et al. | 361/685 |
| 5,808,876 A | * | 9/1998 | Mullenbach et al. | 361/788 |
| 6,459,589 B2 | | 10/2002 | Manweiler et al. | |
| 6,822,874 B1 | | 11/2004 | Marler | |

* cited by examiner

*Primary Examiner*—Tuan Dinh
*Assistant Examiner*—Hung S. Bui
(74) *Attorney, Agent, or Firm*—Clements Walker; Christopher L. Bernard; Tyler S. Brown

(57) ABSTRACT

A modular electronic assembly includes a chassis, a housing supported by the chassis having an access opening through a first wall of the housing, a removable access panel or releasable member at least partially covering the opening, and a midplane supported by the chassis and slidably removable from the chassis through the opening when the housing is mounted on the chassis. A method of constructing a modular electronic assembly is also disclosed.

20 Claims, 8 Drawing Sheets

ELECTRONIC ASSEMBLY WITH MODULAR MIDPLANE

FIELD OF THE INVENTION

The present invention is directed toward an electronic assembly with a removable midplane, and more specifically, toward an electronic assembly comprising a chassis for supporting a plurality of electronic components and a modular removable midplane electrically connectable to electronic components supported by the chassis.

BACKGROUND OF THE INVENTION

Assemblies for supporting a plurality of electrical components and connecting them to various power supplies, inputs, outputs and/or to one another are well known. The electrical components are often modular and can be individually connected to and removed from the assembly. Such assemblies may be referred to, for example, as electrical cabinets or racks and generally comprise a structural frame or chassis that supports the electrical components. The assembly may be at least partially surrounded by a housing to protect the electrical components.

The housing, in some instances, may comprise individual panels secured to the chassis. In other cases, a housing may include structural supports integrated therewith and lack a distinct chassis. As used herein, "chassis" will generally refer to structural elements of an electronic assembly and "housing" will refer to elements provided primarily for protecting or covering the electronic modules whether these elements are separately provided or integrally formed.

It is also known to provide such assemblies with a midplane. A midplane is frequently a printed circuit board (PCB) having a plurality of connectors connectable to the electronic modules supported by the assembly. A midplane is generally provided toward the middle of an assembly and often includes electrical connectors on front and rear surfaces thereof so that modules can be connected to both sides.

Typical assemblies include a chassis that is constructed around a midplane, which essentially makes the midplane an integral part of the chassis. This is especially true in the case of "dual bay" or "multi-bay" assemblies which are arranged to support multiple levels of electronic modules stacked vertically and thus have at least two bays on their front and rear sides. If a midplane requires repair or if an upgrade to the midplane is needed, the chassis must be disassembled to a significant degree to access the midplane. This is often difficult to do at a site where the assembly is installed because it may be difficult or impossible to properly realign the midplane with the chassis when it is reinstalled in the assembly. Moreover, employees or contractors skilled in assembling sheet metal chassis may not be adept at handling printed circuit boards, and a printed circuit board may be damaged when a chassis is assembled around it. Electrostatic discharge, for example, can damage the PCB if care is not taken during chassis assembly.

It would therefore be desirable to provide an electrical assembly to which a midplane may be added after chassis assembly is complete and which allows for the easy removal and replacement of a midplane.

BRIEF DESCRIPTION OF THE DRAWINGS

Various aspects of the invention will become apparent after a reading of the following detailed description of the invention in connection with the following drawings wherein.

DETAILED DESCRIPTION

Figure 1:
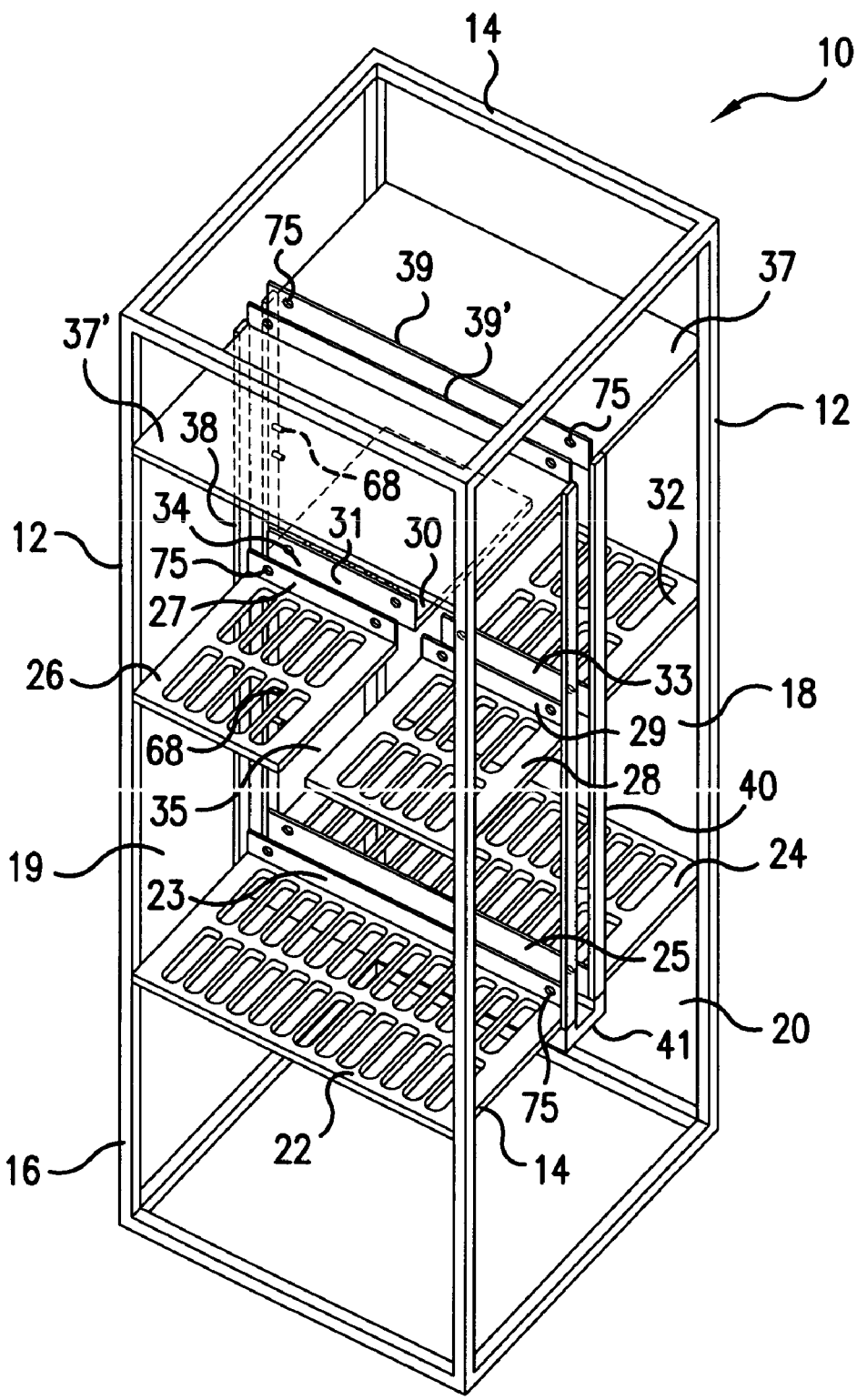
FIG. 1 is a perspective view of a chassis for an assembly according to an embodiment of the present invention.

Referring now to the drawings, wherein the showings are for purposes of illustrating preferred embodiments of the invention only and not for the purpose of limiting same, FIG. 1 illustrates a chassis 10 formed from a plurality of vertical framing members 12 and horizontal framing members 14 interconnected to form an enclosure in the shape of a rectangular parallelepiped having a front 16, a rear 18, a first side 19 and a second side 20. Chassis 10 also includes guide plates for guiding and supporting a number of electronics modules 21 (illustrated in FIG. 3) including a lower front guide plate 22 having a flange 23 and a lower rear guide plate 24 having a flange 25 and four middle guide plates, namely, a first side front guide plate 26 having a flange 27, a second side front guide plate 28 having a flange 29, a first side rear guide plate 30 having a flange 31 and second side rear guide plate 32 having a flange 33. A first gap 34 extending from first side 19 of chassis 10 to second side 20 of chassis 10 is defined by the pair of middle front guide plates 26, 28 and middle rear guide plates 30, 32 for receiving a midplane 36 illustrated, for example in FIG. 2. A second gap 35 running from front 16 of chassis 10 toward rear 18 of chassis 10 is defined by first side guide plates 26, 30 and second side guide plates 28, 32 and may be used to accommodate an added guide plate 43 as illustrated in FIGS. 2 and 3.

In this embodiment, an end plate 38 is provided on first side 19 of chassis 10 at one end of gap 34 and a frame plate 40 is provided on second side 20 of chassis 10 on the end of gap 34 opposite end plate 38. A U-shaped channel support 41 is mounted beneath lower guide plates 22 and 24 and helps guide and support midplane 36 as described hereinafter. Upper guide plates 37, 37' having flanges 39, 39' further define slot 34. While guide plates 37, 37' are illustrated as solid plates, they may alternately be formed with vents such as those formed in lower guide plates 22, 24 and middle guide plates 26, 28, 30, 32.

It should be noted that while a multi-bay assembly having two bays, upper and lower bays 72, on each side is illustrated, an assembly having three or more levels of bays could also be provided. Moreover, the size of the bays is determined by the size of the various electronic modules 21 to be mounted therein, and could differ from what is shown. In addition, while the middle front guide plates 26, 28 and middle rear guide plates 30, 32 (and lower front guide plate 22 and lower rear guide plate 24) are illustrated as lying in substantially the same plane, they could just as readily lie in different planes.

Figure 2:
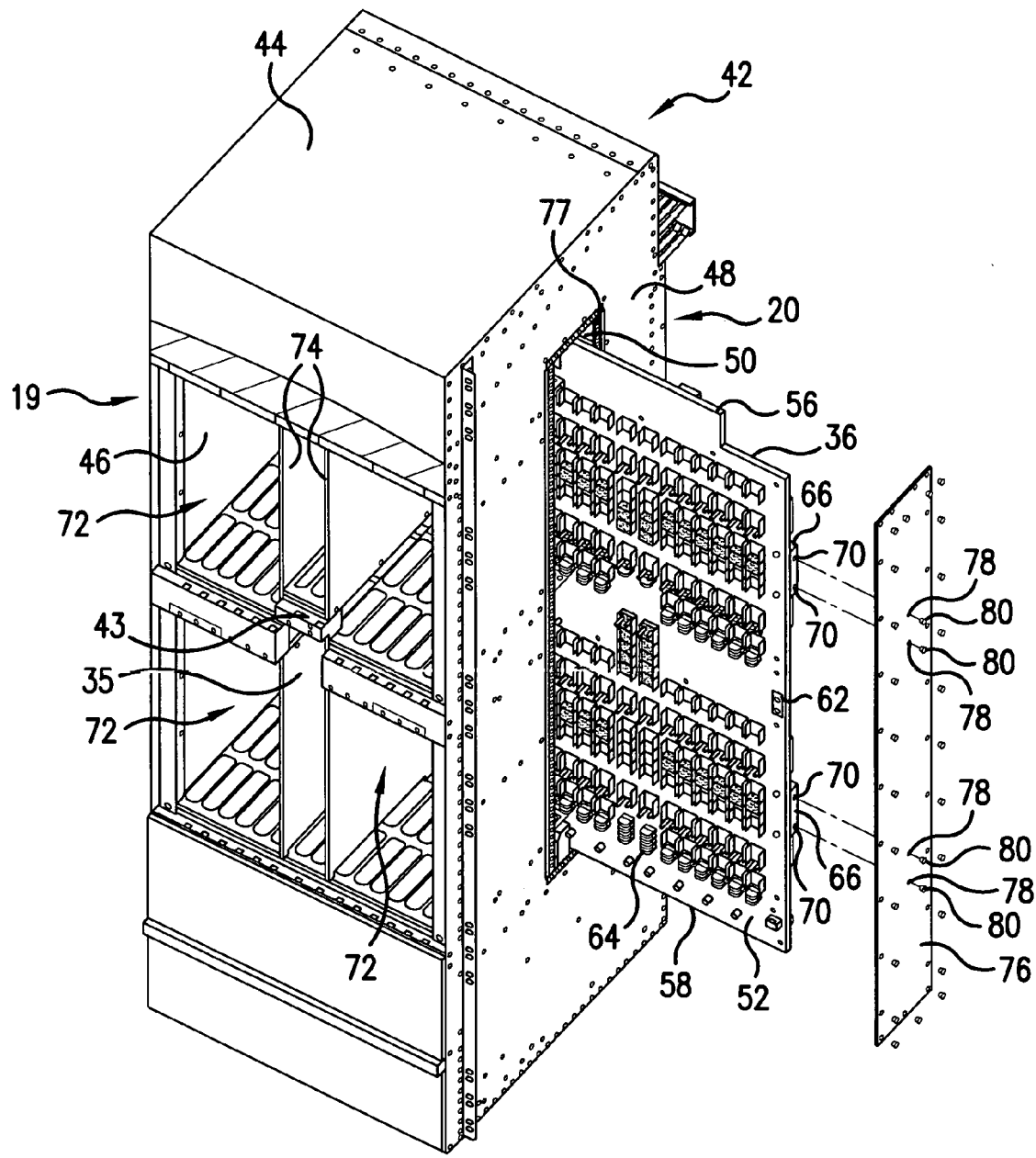
FIG. 2 is a partially exploded perspective view of an assembly including the chassis of FIG. 1, a midplane, and a housing.
Figure 3:
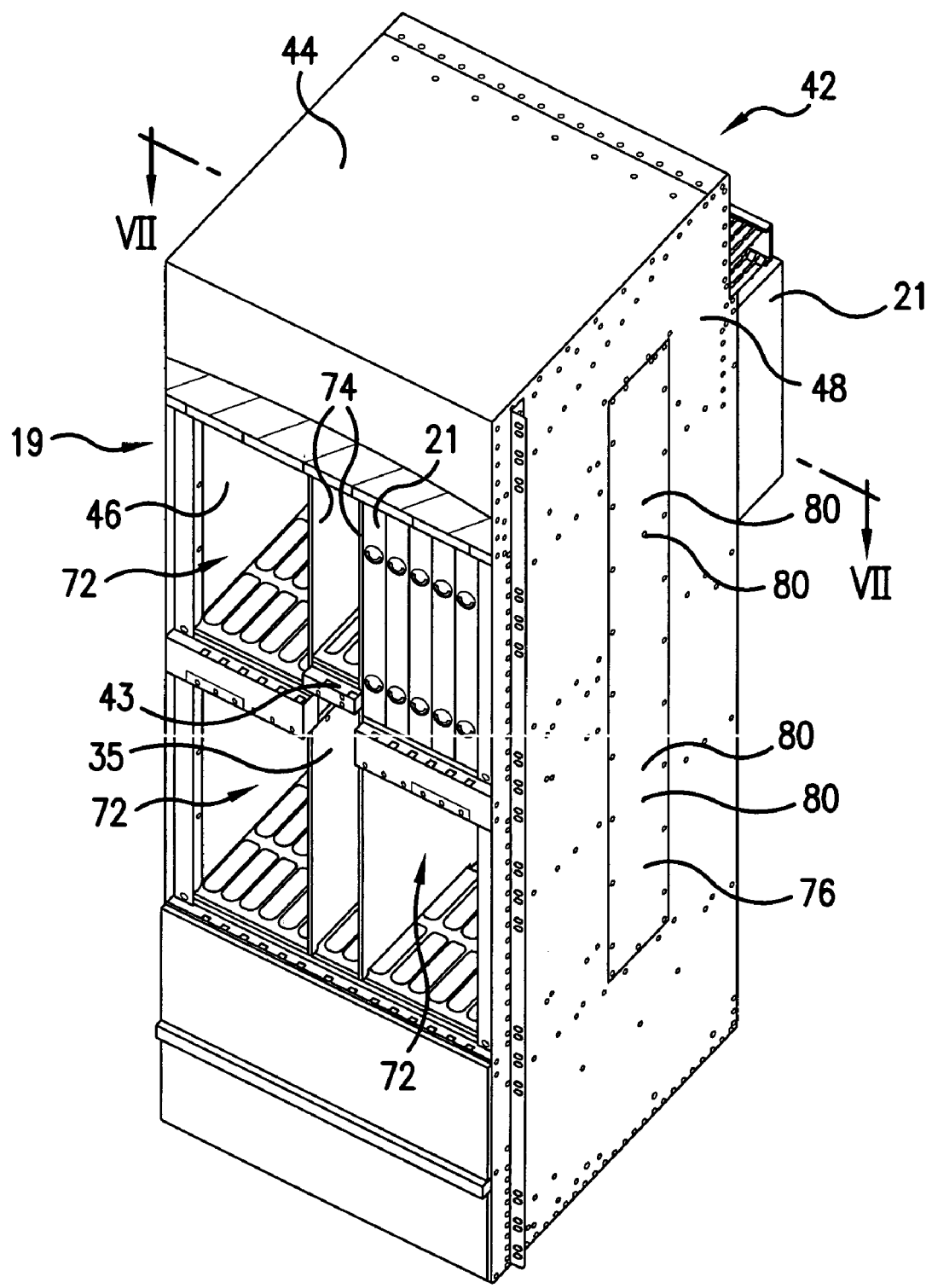
FIG. 3 is a perspective view of the assembly of FIG. 2 including a plurality of electronic modules mounted in bays of the assembly.

FIGS. 2 and 3 illustrate a housing 42 attached to chassis 10. Housing 42 comprises a top panel 44, a first side panel 46 on first side 19 of chassis 10, and a second side panel 48 on the second side 20 of chassis 10. Second side panel 48 includes an opening 50 aligned with frame plate 40 of chassis 10 through which midplane 36 can be inserted into and removed from chassis 10. Housing 42 provides protection for components 21 and may also contribute to the rigidity of the overall assembly. Various openings are provided in housing 42 for cooling and wiring connections in a well known manner.

Figure 5:
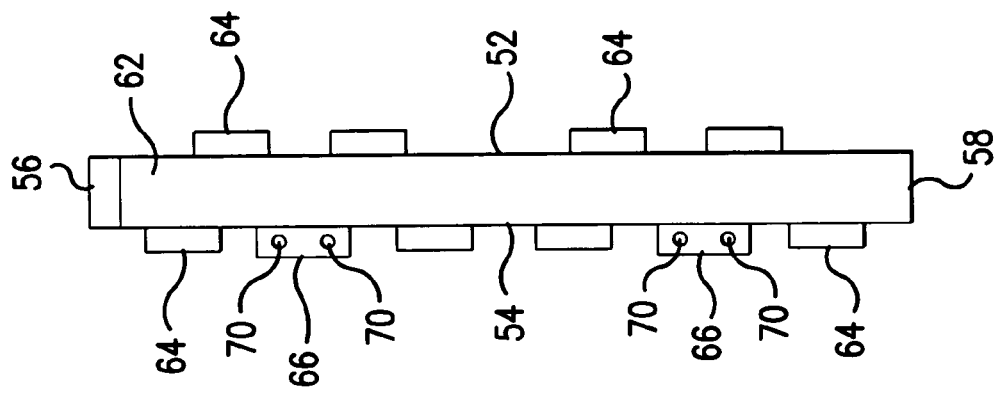
FIG. 5 is a side elevational view of the midplane of FIG. 2.
Figure 4:
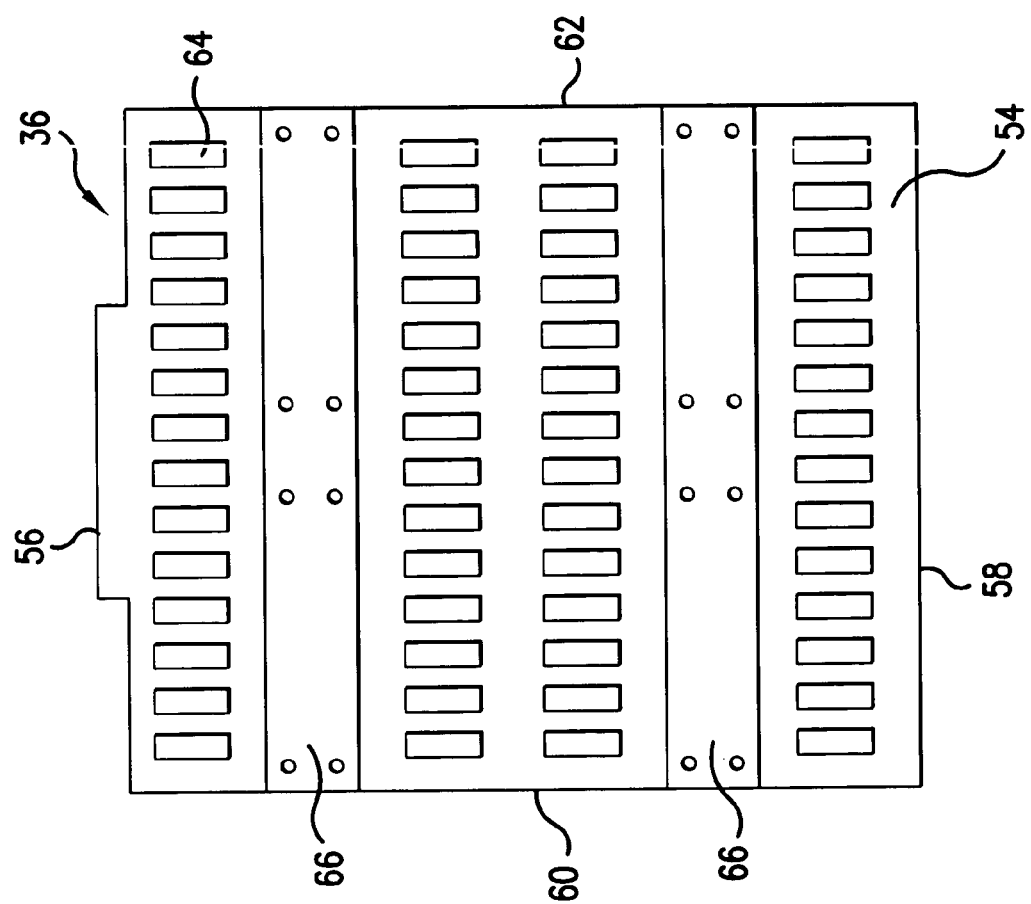
FIG. 4 is a rear elevational view of the midplane of FIG. 2.

Midplane 36 comprises a PCB that includes a front side 52, illustrated in FIG. 3, and a rear side 54 illustrated in FIG. 5. Midplane 36 further comprises an upper edge 56, a lower edge 58, a first side edge 60 and a second side edge 62. A plurality of connectors 64 are provided on front side 52 and rear side 54, the size, type and wiring of which will depend on the types of electronic modules 21 to be used in the assembly. As illustrated in FIGS. 4 and 5, midplane 36 further includes first and second braces or stiffeners 66 running between first side edge 60 and second side edge 62 which are formed from a material such as steel, for example, and are designed to increase the rigidity of midplane 36.

As will be appreciated from FIGS. 1 and 2, midplane 36 can be inserted into chassis 10 through opening 50 in second side panel 48 of the housing and through frame plate 40 of the chassis 10 through gap 34 between front guide plates 26, 28 and rear guide plates 30, 32 until first side edge 60 of midplane 36 abuts end plate 38 of chassis 10. Lower edge 58 of midplane 36 is supported by support 41 while the middle guide plate flanges 27, 29, 31 and 33 and flanges 39, 39' on upper guide plate 37 help guide the midplane along slot 34.

Figure 7:
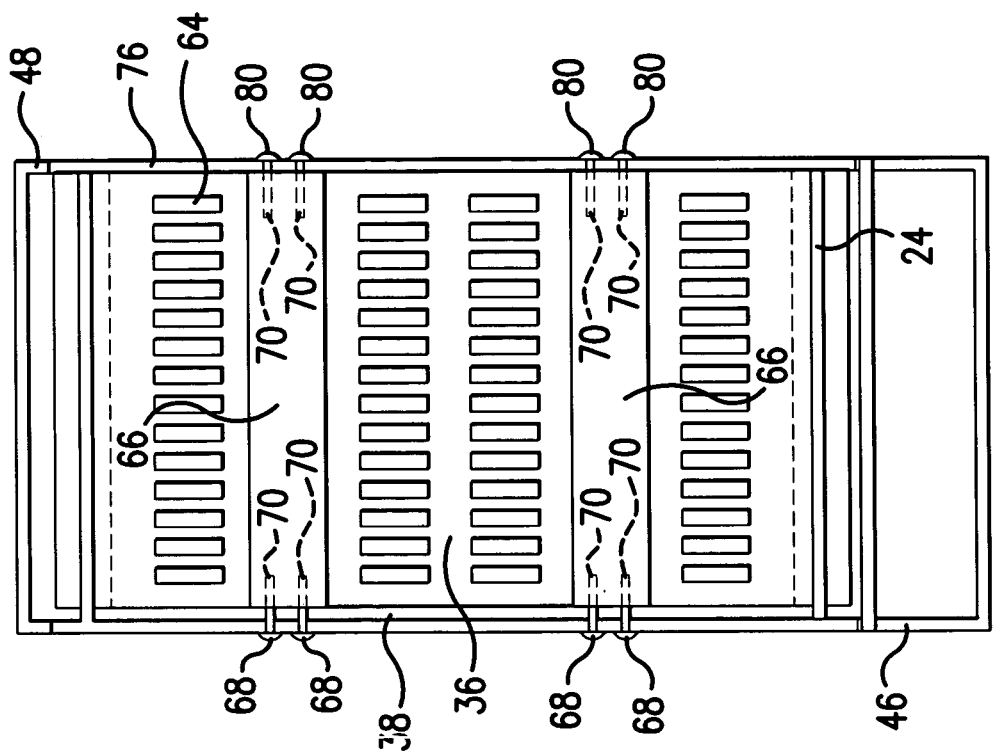
FIG. 7 is a sectional view taken along line VII—VII of FIG. 3 illustrating a first midplane mounting arrangement.

With regard to FIGS. 1 and 7, in this embodiment, end plate 38 includes a plurality of projections 68 which will help to properly align midplane 36 with respect to chassis 10. These projections 68 may comprise pins secured to end plate 38 or screws or other fasteners inserted through openings formed in end plate 38. In a presently preferred embodiment, a combination of alignment pins and screws is used. The specific nature of the alignment mechanism is not critical so long as projections are provided that can be received into alignment openings 70 formed at opposite ends of stiffeners 66.

Figure 6:
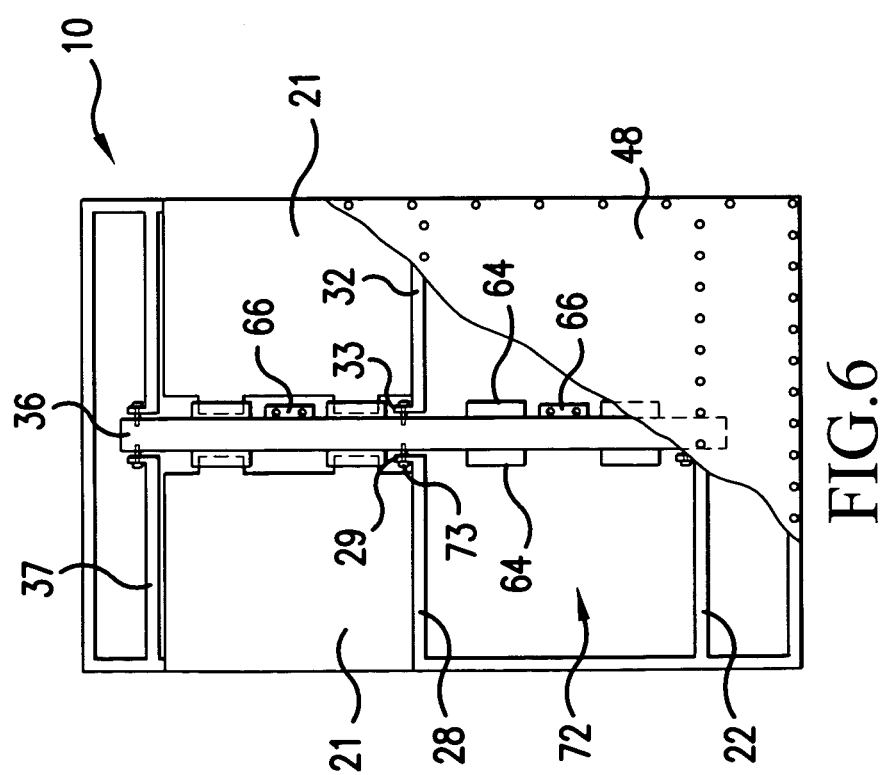
FIG. 6 is a side elevational view, partly in section, of the assembly of FIG. 2.

The alignment openings 70 and projections 68 are arranged and configured so that midplane 36 will assume a predetermined relationship to guide plates 26, 28, 30 and 32, and hence any electrical modules 21 supported by those guide plates, when electrical modules are inserted into the bays 72 defined by the chassis 10, guide plates 26, 28, 30 and 32, and any auxiliary dividers 74 as illustrated in FIGS. 2 and 6. Additional fasteners 73 extend through openings 75 in the flange 23 of lower guide plate 22, though openings 75 in flanges 27 and 29 of middle front guide plates 26 and 28, and through flange 39' of upper guide plate 37' into openings (not shown) in midplane 36 to further secure midplane 36 to the chassis. Additional fasteners 73 are also provided in the flange 25 of lower rear guide plate 24 and in the flanges 31, 33 of middle rear guide plates 30, 32 and in flange 39 of upper guide plate 37 to further align and secure midplane 36.

To accommodate variations in the thickness of midplane 36, slot 34 will generally be slightly wider than the nominal thickness of midplane 36. Therefore, the midplane will be rigidly fastened to only one set of flanges, such as rear flanges 25, 31, 33, 39. Fasteners 73 extending through front flanges 23, 27, 29 and 39' will extend into openings in the midplane to help hold the midplane in proper position, but the midplane will generally be slightly spaced from these front flanges.

With projections 68 inserted into the alignment openings 70 near first side edge 60 of midplane 36, alignment openings 70 near second side edge 62 of midplane 36 remain exposed through opening 50 in second side panel 48. An access panel 76 is provided that is sized to cover opening 50 and attach to second side panel 48 and/or frame plate 40. Access panel 76 includes an EMI gasket 77 to provide an EMI seal around opening 50, and openings 78 aligned with alignment openings 70 near second side edge 62 of midplane 36. Suitable fasteners 80, such as pins or screws are inserted through openings 78 and into alignment openings 70 of midplane 36. When access panel 76 is then secured to housing 42, midplane 36 will be secured in a proper orientation with respect to the chassis 10. Because midplane 36 is locked in place in this manner, it not only maintains a necessary orientation with respect to the chassis 10 and supported electronic elements 21, but it, together with stiffeners 66, braces and contributes to the rigidity of chassis 10. As will appreciated from the foregoing, this arrangement simplifies the removal and repair or replacement of midplane 36 as well.

In a variation of the above embodiment, end plate 38 can be omitted and projections 68 may be supported by first side panel 46 of housing 42. Likewise, frame plate 40 can be omitted and the access panel 76 may be connected directly to second side panel 48 of housing 42.

Figure 8:
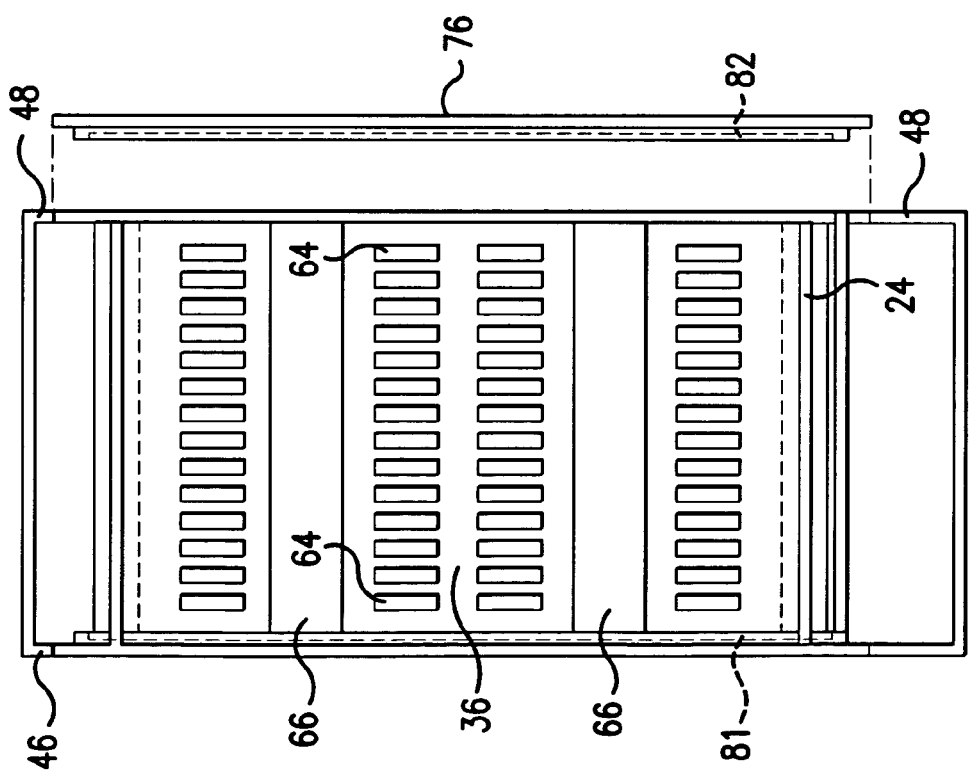
FIG. 8 is a sectional front elevational view of an assembly according to an embodiment of the present invention illustrating a first alternate midplane mounting arrangement.

An additional variation of this embodiment of the invention is illustrated in FIG. 8. Elements identical to those in the first variation are identified with like reference numerals. In this embodiment, a guide channel 80 is provided on end plane 38 (or directly mounted on housing first side panel 46), and first side edge 60 of midplane 36 is inserted into this guide channel 80 to hold the midplane 36 in proper orientation with respect to chassis 10. Access panel 76 is also provided with a guide channel 82 which is placed over second side edge 62 of midplane 36 as access panel 76 is secured to housing 42. Guide channel 80 and access panel guide channel 82 hold midplane 36 securely in place within chassis 10 this secure interconnection allows midplane 36 to increase the rigidity of chassis 10.

Figure 9:
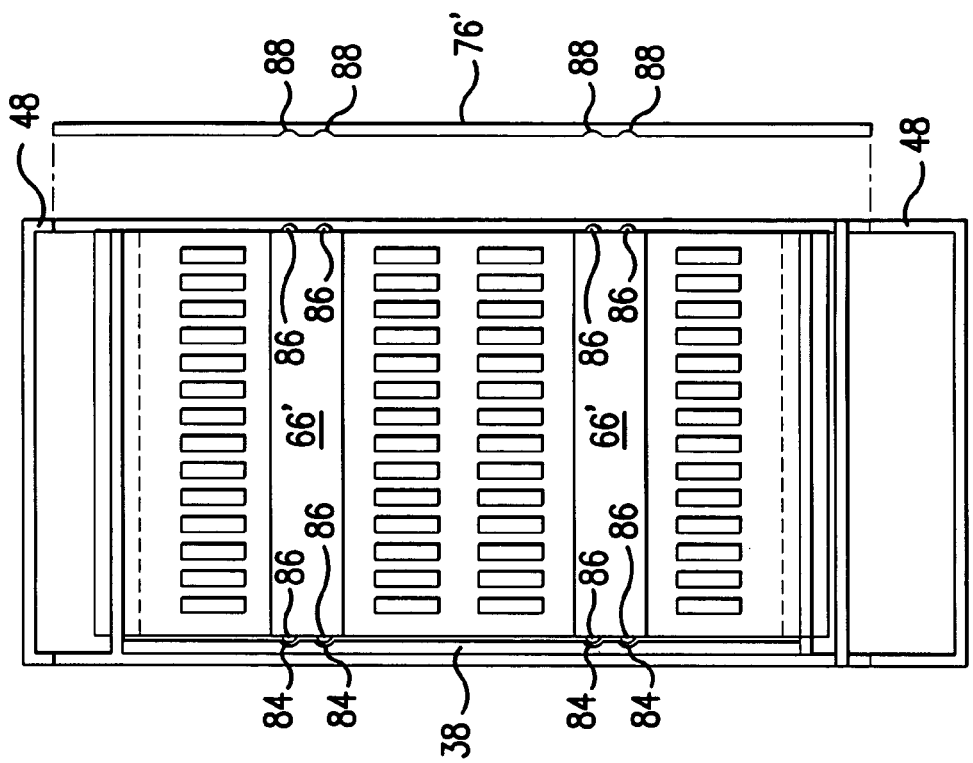
FIG. 9 is a sectional front elevational view of an assembly according to an embodiment of the present invention illustrating a third alternate midplane mounting arrangement.

FIG. 9 illustrates an alternate variation of the invention in which elements common to the earlier variations are identified with the same reference numerals; elements related to previously identified elements are identified with the same reference numeral and a prime. In this embodiment, end plate 38 (or first side panel 46 of housing 42) is provided with openings 84 that receive projections 86 of stiffeners 66'. Openings 88 on access panel 76' receive projections 86 near the second side edge 62 of midplane 36. Projections 86 and openings 84, 88 are arranged such that midplane 36 is properly positioned within chassis 10 when the projections are received within the openings and access panel 76 is secured to housing 42.

Figure 10:
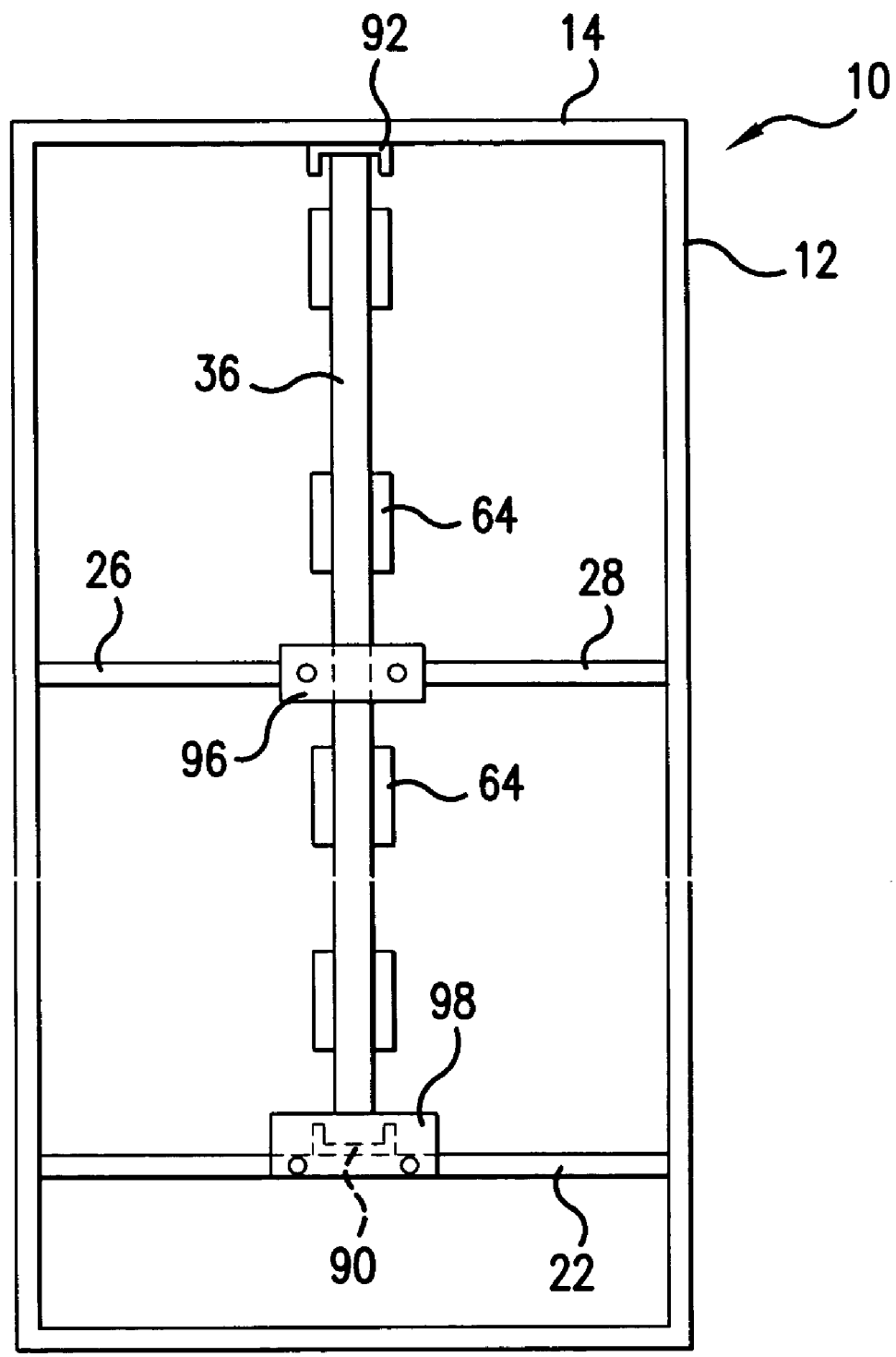
FIG. 10 is a side elevational view of an assembly according to a second embodiment of the present invention.

FIG. 10 illustrates a second embodiment of the present invention in which elements common to the earlier embodiments are identified with like reference numerals. In this embodiment, chassis 10 is open and not covered with panels forming a housing as in the first embodiment. A lower bracket 90 is provided on lower guide plate 24 while an upper bracket 92 is provided between two of the horizontal framing members 12 forming chassis 10. Lower bracket 90 and upper bracket 92 define, with gap 34, an opening into which a midplane 36 can be inserted into chassis 10. A first member, such as plate 96 is removably connected between second side front guide plate 28 and second side rear guide plate 32 and a second member, such as plate 98 is removably connected to lower guide plate 24 to hold midplane 36 in place. The end of gap 34 at first side 19 of chassis 10 may be blocked by a portion of one of the horizontal framing members 14 that form chassis 10 or by an additional plate 96. This arrangement allows the benefits of embodiments of the present invention to be enjoyed even in rack arrangements with an open chassis.

Figure 11:
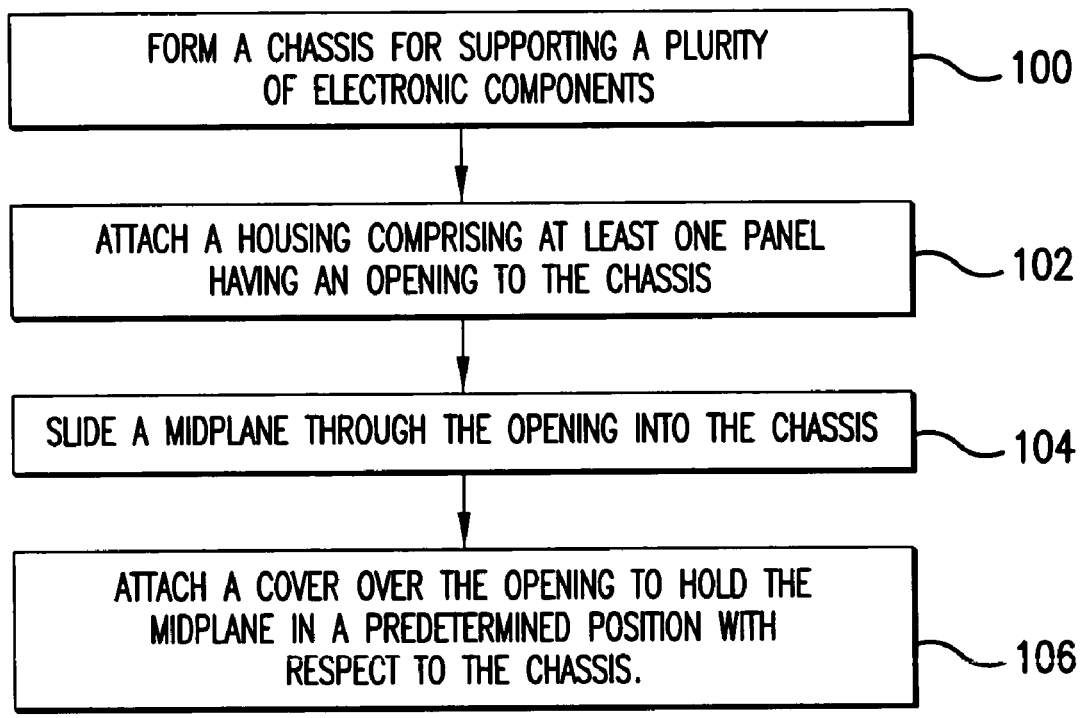
FIG. 11 is a flow chart illustrating a method of assembling an electrical assembly according to an aspect of the present invention.

A method of practicing an embodiment of the present invention is illustrated in the flow chart of FIG. 11. In a first step 100, a chassis is formed for supporting a plurality of electronic elements. A housing comprising at least one panel having an opening is attached to the chassis at a step 102. At a step 104, a midplane is slid through the opening into the chassis, and at a step 106, a cover is attached over the opening to hold the midplane in a predetermined position with respect to the chassis.

The present invention has been described herein in terms of several embodiments. Numerous modifications and additions to these embodiments will become apparent to those skilled in the relevant arts upon a reading and understanding of the foregoing description. It is intended that all such modifications and additions form a part of the present invention to the extent they fall within the scope of the several claims appended hereto.

We claim:

1. A modular electronic assembly comprising:
a multi-bay chassis;
a housing supported by the chassis and having an access opening through a first wall of the housing;
an access panel removably covering said opening; and
a midplane supported by said chassis and slidably removable from said chassis through the access opening when said housing is mounted on said chassis.

2. The assembly of claim 1, wherein:
said midplane is configured to receive a plurality of electronic connectors on both sides of the midplane;
and said chassis has at least one bay on each side of the midplane configured to receive an electronic module for connecting to a respective one of said plurality of electronic connectors on said midplane; and
said housing at least partially surrounds the chassis.

3. The assembly of claim 2 including alignment means for holding said midplane in a predetermined position with respect to said chassis.

4. The assembly of claim 3 including a plurality of guide plates for guiding and supporting a plurality of electronic modules mountable on said chassis wherein said plurality of guide plates comprise said alignment means.

5. The assembly of claim 2 wherein said midplane includes at least one midplane edge and said chassis includes at least one channel receiving said at least one midplane edge.

6. The assembly of claim 2 wherein said housing includes a second wall opposite the access opening and at least one alignment opening on said second wall or on said chassis opposite the access opening for receiving at least one first alignment projection on said midplane.

7. The assembly of claim 6 wherein said access panel includes at least one alignment opening for receiving at least one second alignment projection on said midplane.

8. The assembly of claim 2 wherein said housing includes a second wall opposite said opening, and at least one alignment projection on said second wall or on said chassis opposite the access opening, the alignment projection being receivable in at least one first opening in said midplane.

9. The assembly of claim 8 wherein said access panel includes at least one alignment projection receivable in at least one second opening in said midplane.

10. The assembly of claim 8 wherein said at least one alignment projection comprises at least one fastener extending through the access panel and into the midplane.

11. The assembly of claim 8 wherein said midplane includes at least one stiffening element and said at least one first opening is located in said at least one stiffening element.

12. A modular electronic assembly comprising:
a multi-bay chassis; and
a midplane configured to receive electronic modules on both sides of the midplane supported by said chassis;
said chassis defining a slot normal to the plane of the midplane large enough for said midplane to pass though; and a member releasably connected to said chassis, said member being movable between a first position at least partially blocking said slot and holding said midplane in a predetermined position with respect to said chassis and a second position away from said slot; whereby said midplane is slidably removable from said chassis when said member is in said second position.

13. The assembly of claim 12 further including a housing supported by said chassis, said housing including an opening aligned with said slot.

14. The assembly of claim 13 wherein said member comprises an access panel on said housing.

15. The assembly of claim 12 further including alignment means for holding said midplane in a predetermined position with respect to said chassis.

16. The assembly of claim 12 including:
a housing supported by said chassis and including at least one panel having an opening large enough for said midplane to pass through;
at least one stiffening element on said midplane having first and second ends and at least one alignment opening at each of said first and second ends;
at least one alignment projection on said housing or chassis extending into the at least one alignment opening at the first end of said at least one stiffening element; and
an access panel having an access panel alignment projection extending into the at least one alignment opening on the second end of said stiffening element when the access panel is secured to the housing over the opening in the panel.

17. A method of assembling an electronic support comprising a chassis and a midplane comprising:
forming a chassis for supporting a plurality of electronic components;
releasably attaching a housing to said chassis and at least partially surrounding said chassis;
providing at least one panel on said housing having an opening to the chassis;
sliding a midplane through the opening into the chassis; and attaching a cover over the opening to hold the midplane in a predetermined position with respect to the chassis.

18. The method of claim 17 wherein said step of sliding the midplane through the opening into the chassis comprises the steps of aligning a portion of the midplane with alignment means on the chassis and securing the cover to the midplane.

19. The method of claim 17 wherein said step of sliding the midplane through the opening into the chassis comprises:

aligning at least one opening on the midplane with at least one alignment projection on the chassis or housing;

sliding the midplane into engagement with the alignment projection; and securing the cover to the midplane and the chassis or housing.

20. The method of claim 17 including the additional step of removing the cover, sliding the midplane through the opening and out of the chassis, sliding a replacement midplane through the opening into the chassis and reattaching the cover over the opening to hold the replacement midplane in the chassis.

* * * * *